(12) United States Patent
Park et al.

(10) Patent No.: US 9,599,654 B2
(45) Date of Patent: Mar. 21, 2017

(54) FAULT CURRENT DETECTING CIRCUIT

(71) Applicant: LSIS CO., LTD., Anyang-si, Gyeonggi-do (KR)

(72) Inventors: Hae Yong Park, Changwon-si (KR); Jung Wook Sim, Cheongju-si (KR); Gyeong Ho Lee, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/793,439

(22) Filed: Jul. 7, 2015

(65) Prior Publication Data

US 2016/0018457 A1 Jan. 21, 2016

(30) Foreign Application Priority Data

Jul. 15, 2014 (KR) .................. 10-2014-0089283

(51) Int. Cl.
*G01R 31/02* (2006.01)
*H02H 3/10* (2006.01)
*G01R 19/165* (2006.01)

(52) U.S. Cl.
CPC ......... *G01R 31/027* (2013.01); *G01R 19/165* (2013.01); *H02H 3/105* (2013.01)

(58) Field of Classification Search
CPC .... G01R 31/024; G01R 31/025; G01R 31/14; G01R 35/00; G01R 25/00; G01R 31/327; G01R 19/00; G01R 19/165; G01R 21/06; G01R 31/041; G01R 15/18; G01R 31/027; G01R 31/06; H01H 2071/044; H01H 83/04;

(Continued)

(56) References Cited

U.S. PATENT DOCUMENTS 3,786,311 A 1/1974 Hobson et al.
4,068,283 A 1/1978 Russell
(Continued)

FOREIGN PATENT DOCUMENTS

EP 2728691 5/2014
GB 2279189 12/1994
(Continued)

OTHER PUBLICATIONS

European Patent Office Application Serial No. 15175678.0, Search Report dated Nov. 17, 2015, 8 pages.
Korean Intellectual Property Office Application Serial No. 10-2014-0089283, Notice of Allowance dated May 20, 2015, 3 pages.
Japan Patent Office Application Serial No. 2015-141161, Office Action dated Jun. 14, 2016, 2 pages.

*Primary Examiner* — Vinh Nguyen
(74) *Attorney, Agent, or Firm* — Lee Hong Degerman Kang & Waimey (57) ABSTRACT

A fault current detection circuit comprises a primary current transformer that detects a current; a pair of secondary current transformers that convert a current detection signal into secondary conversion signals with a small current; a fault detection circuit section that determines whether or not a fault current occurs by comparing a current value according to a secondary conversion signal with a predetermined reference current value; a surge detection circuit section that determines whether or not a surge current occurs on the electric power circuit; and a trip determination unit that receives a fault detection signal and a surge detection signal, and generates a trip control signal when at least either one of the fault detection signal and the surge detection signal is received.

8 Claims, 3 Drawing Sheets (58) Field of Classification Search
CPC ........ H01H 71/50; H01H 83/20; H01H 71/74; H01H 83/02; H01H 83/144; H01H 83/226; G06F 1/266; G06F 1/3215; G06F 1/3287
See application file for complete search history.

(56) References Cited

U.S. PATENT DOCUMENTS

| | | | | |
|---|---|---|---|---|
| 6,031,699 | A * | 2/2000 | Dollar, II | H02H 1/0015 361/42 |
| 6,275,044 | B1 * | 8/2001 | Scott | H02H 7/26 324/520 |
| 2002/0085327 | A1 * | 7/2002 | Kim | H02H 3/04 361/42 |
| 2010/0324747 | A1 | 12/2010 | Lee et al. | |

FOREIGN PATENT DOCUMENTS

| | | |
|---|---|---|
| JP | 49-125837 | 12/1974 |
| JP | 62-173914 | 7/1987 |
| JP | 04-017286 | 3/1992 |
| JP | 10-014094 | 1/1998 |
| JP | 10-336874 | 12/1998 |
| JP | 11-164468 | 6/1999 |
| JP | 2002-84653 | 3/2002 |
| JP | 2014-89955 | 5/2014 |
| KR | 10-1118375 | 3/2012 |
| KR | 10-2014-0055129 | 5/2014 |

* cited by examiner

FAULT CURRENT DETECTING CIRCUIT

CROSS-REFERENCE TO RELATED APPLICATIONS

Pursuant to 35 U.S.C. §119(a), this application claims the benefit of earlier filing date and right of priority to Korean Patent Application No. 10-2014-0089283, filed on Jul. 15, 2014, the contents of which are hereby incorporated by reference herein in its entirety.

BACKGROUND OF THE INVENTION

1. Field of the Invention

The present disclosure relates to a fault current limiter which is one of electric power receiving and distributing equipment, and more particularly, to a high-speed fault current detection circuit for the fault current limiter.

2. Description of the Related Art

As a protection device for protecting an electric circuit from a fault current such as an overcurrent or short-circuit current, a fault current limiter (can be abbreviated as "FCL"), which is one of electric power receiving and distributing equipment, is an apparatus for reducing a fault current below an appropriate value within a short period of time to enhance the mechanical/thermal stress prevention of an electric power device and grid reliability when a large fault current occurs in a grid.

For an example of conventional technologies for high-speed fault current detection circuits as such fault current limiters, the following patent literature disclosed by the applicant of the present disclosure is descried below for reference.

(Patent Literature 1) KR10-2014-0055129 A

A high-speed fault current detection circuit in the related art according to the patent document has a configuration in which a detection signal detected through one common secondary current transformer is shared for a fault currents and surge currents. In terms of a current signal received in the high-speed fault current detection circuit, the size of a surge current is significantly larger than that of a fault current, and thus has a big difference therebetween, and when it is detected with a common detection device and amplified with a common amplifier circuit section, the detection accuracy of a fault current having a size smaller than that of a surge current is reduced, thus causing a problem in the reliability of the high-speed fault current detection circuit as a whole.

SUMMARY OF THE INVENTION

Accordingly, the present disclosure is provided to solve the problem in the related art, and an aspect of the present disclosure is to provide a high-speed fault current detection circuit capable of enhancing the detection accuracy of a fault current exceeding a rated current of a circuit breaker while at the same time allowing the accurate detection of a surge current to enhance reliability.

The foregoing object of the present disclosure may be accomplished by providing a high-speed fault current detection circuit, comprising:

a primary current transformer configured to detect a current flowing through an electric power circuit in a grid to output a current detection signal;

a pair of secondary current transformers connected to the primary current transformer to convert and provide the current detection signal provided by the primary current transformer into secondary conversion signals, respectively, with a small current;

a fault detection circuit section connected to any one output terminal of the one pair of secondary current transformers to determine whether or not a fault current occurs on the electric power circuit by comparing a current value represented by a secondary conversion signal outputted by either one of the one pair of secondary current transformers with a predetermined reference current value, and output a fault detection signal when determined that the fault current has occurred;

a surge detection circuit section connected to the other output terminal of the one pair of secondary current transformers to determine whether or not a surge current occurs on the electric power circuit by comparing a current value represented by a secondary conversion signal outputted by the other one of the one pair of secondary current transformers with a predetermined reference current value, and output a surge detection signal when determined that the surge current has occurred; and a trip determination unit connected to output terminals of the fault detection circuit section and the surge detection circuit section to receive the fault detection signal and the surge detection signal, and generates a trip control signal when at least either one of the fault detection signal and the surge detection signal is received.

According to one aspect of the present disclosure, the high-speed fault current detection circuit according to present disclosure, further comprising:

a first amplifier circuit section connected between either one output terminal of the one pair of secondary current transformers and the fault detection circuit section to amplify a secondary conversion signal outputted by either one of the one pair of secondary current transformers and output the amplified secondary conversion signal to the fault detection circuit section;

a first differentiator connected between either one output terminal of the one pair of secondary current transformers and the fault detection circuit section to differentiate a secondary conversion signal outputted by either one of the one pair of secondary current transformers and output a change gradient of the secondary conversion signal to the fault detection circuit section;

a second amplifier circuit section connected between the other output terminal of the one pair of secondary current transformers and the surge detection circuit section to amplify a secondary conversion signal outputted by the other one of the one pair of secondary current transformers and output the amplified secondary conversion signal to the surge detection circuit section; and a second differentiator connected between the other output terminal of the one pair of secondary current transformers and the surge detection circuit section to differentiate a secondary conversion signal outputted by the other one of the one pair of secondary current transformers and output a change gradient of the secondary conversion signal to the surge detection circuit section.

According to another aspect of the present disclosure, the fault detection circuit section comprises:

a first comparator connected to an output terminal of the first amplifier circuit section to compare a current value represented by the amplified secondary conversion signal from the first amplifier circuit section with a predetermined first reference value; and a second comparator configured to compare the change gradient with a predetermined second reference value.

According to still another aspect of the present disclosure, the surge detection circuit section comprises:

a third comparator connected to an output terminal of the second amplifier circuit section to compare a current value represented by the amplified secondary conversion signal from the second amplifier circuit section with a predetermined third reference value; and a fourth comparator configured to compare a change gradient of the secondary conversion signal outputted by the second differentiator with a predetermined fourth reference value.

According to still another aspect of the present disclosure, the high-speed fault current detection circuit according to present disclosure further comprising:

a first amplifier circuit section connected to either one output terminal of the one pair of secondary current transformers to amplify a secondary conversion signal outputted by either one of the one pair of secondary current transformers and output the amplified secondary conversion signal;

a first differentiator connected to either one output terminal of the one pair of secondary current transformers to differentiate a secondary conversion signal outputted by either one of the one pair of secondary current transformers and output a change gradient of the secondary conversion signal;

a third amplifier circuit section connected to an output terminal of the first differentiator to amplify and output a change gradient of the secondary conversion signal outputted by the first differentiator;

a second amplifier circuit section connected to the other output terminal of the one pair of secondary current transformers to amplify a secondary conversion signal outputted by the other one of the one pair of secondary current transformers and output the amplified secondary conversion signal;

a second differentiator connected to the other output terminal of the one pair of secondary current transformers to differentiate a secondary conversion signal outputted by the other one of the one pair of secondary current transformers and output a change gradient of the secondary conversion signal; and a fourth amplifier circuit section connected to an output terminal of the second differentiator to amplify a change gradient of the secondary conversion signal outputted by the second differentiator, wherein the fault detection circuit section comprises:

a first comparator connected to an output terminal of the first amplifier circuit section to compare a current value represented by the amplified secondary conversion signal from the first amplifier circuit section with a predetermined first reference value so as to output a first fault detection signal when the current value represented by the amplified secondary conversion signal is no less than the first reference value; and a second comparator connected to an output terminal of the third amplifier circuit section to compare an amplification value of the change gradient from the third amplifier circuit section with a predetermined second reference value so as to output a second fault detection signal when the change gradient from the third amplifier circuit section is no less than the second reference value, and the surge detection circuit section comprises:

a third comparator connected to an output terminal of the second amplifier circuit section to compare a current value represented by the amplified secondary conversion signal from the second amplifier circuit section with a predetermined third reference value so as to output a first surge detection signal when the current value represented by the amplified secondary conversion signal from the second amplifier circuit section is no less than the third reference value; and a fourth comparator connected to an output terminal of the fourth amplifier circuit section to compare an amplification value of the change gradient from the fourth amplifier circuit section with a predetermined fourth reference value so as to output a second surge detection signal when the amplification value of the change gradient from the fourth amplifier circuit section is no less than the fourth reference value, and the trip determination unit is connected to output terminals of the fault detection circuit section and the surge detection circuit section to receive the first fault detection signal, second fault detection signal, first surge detection signal and second surge detection signal, and configured to generate a trip control signal when at least any one of the first fault detection signal, second fault detection signal, first surge detection signal and second surge detection signal is received.

According to still another aspect of the present disclosure, when an amplification ratio of the first amplifier circuit section is a first amplification ratio, and an amplification ratio of the second amplifier circuit section is a second amplification ratio, and an amplification ratio of the third amplifier circuit section is a third amplification ratio, and an amplification ratio of the fourth amplifier circuit section is a fourth amplification ratio, the first amplification ratio>the second amplification ratio, and the third amplification ratio>the fourth amplification ratio.

According to still another aspect of the present disclosure, the trip determination unit is configured with a logical OR circuit.

According to still another aspect of the present disclosure, the trip determination unit is configured with a logical AND circuit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The objective of the present invention, as well as the configuration and working effect thereof to accomplish the foregoing objective will be more clearly understood by the following description for the preferred embodiments of present disclosure with reference to the accompanying drawings.

First, the configuration of a high-speed fault current detection circuit according to a preferred embodiment of the present disclosure will be described with reference to FIG. 1.

Figure 1:
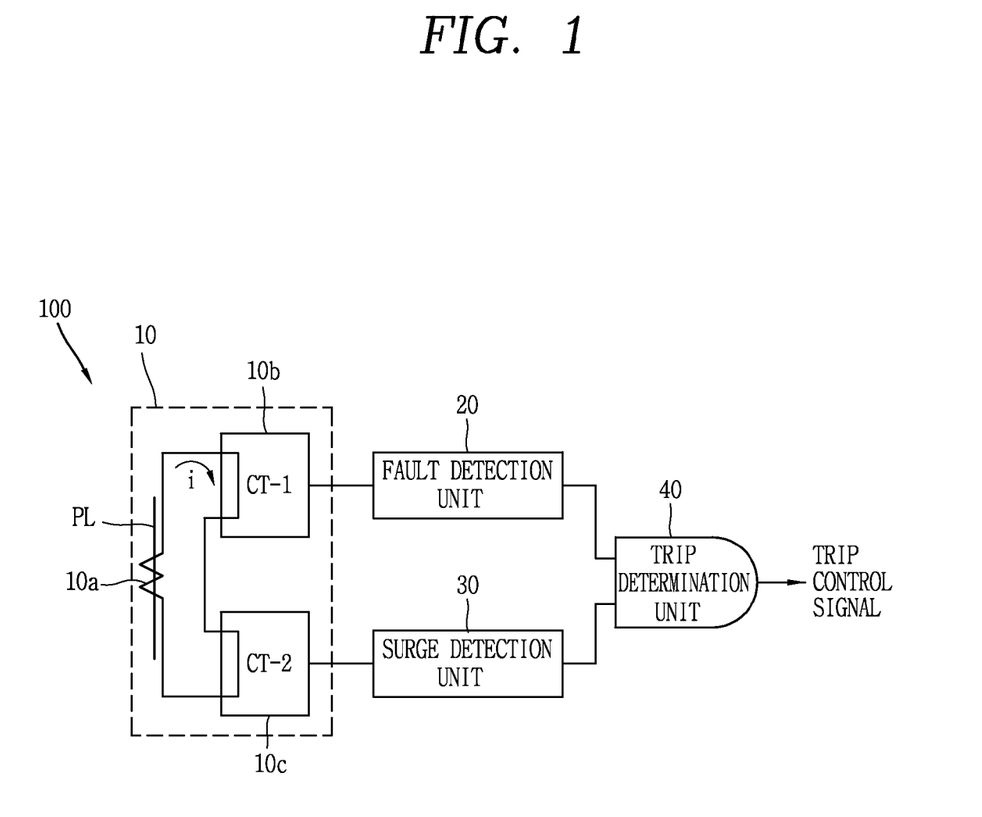
FIG. 1 is a block diagram illustrating the configuration of a high-speed fault current detection circuit according to an embodiment of the present disclosure.

Referring to FIG. 1, a high-speed fault current detection circuit according to a first preferred embodiment of the present disclosure comprises a primary current transformer 10a, a pair of secondary current transformers 10b, 10c, a fault detection circuit section 20, a surge detection circuit section 30 and a trip determination circuit section 40.

As a circuit section included in a current detection unit 10, the primary current transformer 10a may detect a current flowing through a power circuit (PL) in a grid and primarily detect and output a current detection signal (i).

The pair of secondary current transformers 10b, 10c are connected to the fault detection circuit section 20 and surge detection circuit section 30, respectively, through output terminals thereof to convert the current detection signal provided by the primary current transformer 10a into secondary conversion signals, respectively, with a small current so as to provide them to the fault detection circuit section 20 and surge detection circuit section 30, respectively. Here, the pair of secondary current transformers 10b, 10c may be referred to as a secondary current transformer-1 10b and a secondary current transformer-2 10c, respectively.

The fault detection circuit section 20 is connected to an output terminal of either one of the pair of secondary current transformers 10b, 10c, namely, the secondary current transformer-1 10b, to determine that a fault current occurs on the power circuit by comparing a current value represented by a secondary conversion signal outputted from the secondary current transformer-1 10b with a predetermined reference current when the current value is equal to or larger than a value of the predetermined reference current, and output a signal with a logical value "1" (one) as a fault detection signal when determined that a fault current has occurred. Here, the value of the predetermined reference current may be predetermined as a current value in proportion to a rated current value of a circuit breaker or fault current limiter connected to the high-speed fault current detection circuit.

The surge detection circuit section 30 is connected to an output terminal of the other one of the pair of secondary current transformers 10b, 10c, namely, the secondary current transformer-2 10c, to determine that a surge current occurs on the power circuit by comparing a current value represented by a secondary conversion signal outputted from the secondary current transformer-2 10c with a predetermined reference current when the current value is equal to or larger than a predetermined reference current value, and output a signal with a logical value "1" as a surge detection signal when determined that a surge current has occurred. Here, the predetermined reference current value may be predetermined as a current value of signal that can be recognized as a predetermined typical surge signal.

The trip determination circuit section 40 is connected to an output terminals of the fault detection circuit section 20 and surge detection circuit section 30 to receive the fault detection signal and the surge detection signal to generate a trip control signal when at least either one of the fault detection signal and the surge detection signal is received. To this end, the trip determination circuit section 40 may be configured with a logical OR circuit or logical AND circuit.

On the other hand, the configuration of a high-speed fault current detection circuit according to a second preferred embodiment of the present disclosure will be described with reference to FIG. 2.

Figure 2:
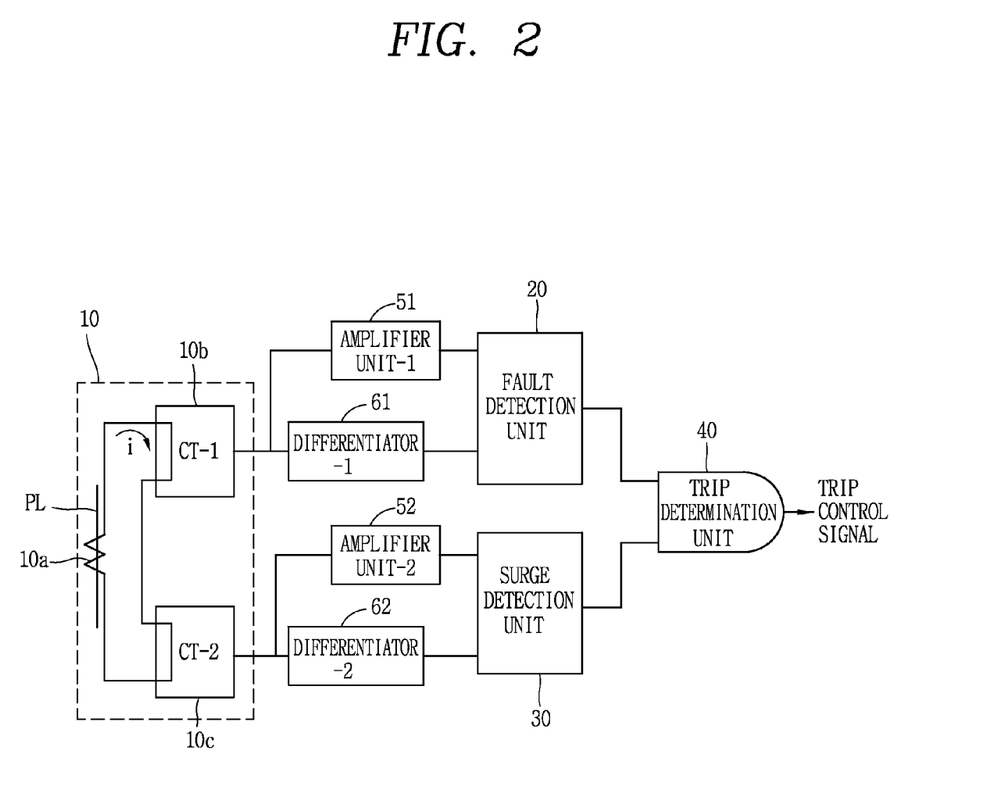
FIG. 2 is a block diagram illustrating the configuration of a high-speed fault current detection circuit according to another embodiment of the present disclosure.

As illustrated in FIG. 2, a high-speed fault current detection circuit according to a second preferred embodiment of the present disclosure comprises a primary current transformer 10a, a pair of secondary current transformers 10b, 10c, a first amplifier circuit section 51, a first differentiator 61, a second amplifier circuit section 52, a second differentiator 62, a fault detection circuit section 20, a surge detection circuit section 30 and a trip determination circuit section 40.

As illustrated in FIG. 2, a high-speed fault current detection circuit according to a second preferred embodiment of the present disclosure further comprises a first amplifier circuit section 51, a first differentiator 61, a second amplifier circuit section 52 and a second differentiator 62 as a configuration difference from the foregoing high-speed fault current detection circuit according to a first preferred embodiment of the present disclosure. Accordingly, only different configuring elements will be described to avoid the redundant description thereof.

The first amplifier circuit section 51 is connected between an output terminal of the secondary current transformer-1 10b of the pair of secondary current transformers and the fault detection circuit section 20 to amplify a secondary conversion signal outputted from the secondary current transformer-1 10b and output the amplified secondary conversion signal to the fault detection circuit section 20.

The first differentiator 61 is connected between an output terminal of the secondary current transformer-1 10b of the pair of secondary current transformers and the fault detection circuit section 20 to differentiate a secondary conversion signal outputted from the secondary current transformer-1 10b and output a change gradient of the secondary conversion signal to the fault detection circuit section 20.

The second amplifier circuit section 52 is connected between an output terminal of the secondary current transformer-2 10c of the pair of secondary current transformers and the surge detection circuit section 30 to amplify a secondary conversion signal outputted from the secondary current transformer-2 10c and output the amplified secondary conversion signal to the surge detection circuit section 30.

The second differentiator 62 is connected between an output terminal of the secondary current transformer-2 10c of the pair of secondary current transformers and the surge detection circuit section 30 to differentiate a secondary conversion signal outputted from secondary current transformer-2 10c of the pair of secondary current transformers and output a change gradient of the secondary conversion signal to the surge detection circuit section 30.

On the other hand, the configuration of a high-speed fault current detection circuit according to a third preferred embodiment of the present disclosure will be described with reference to FIG. 3.

Figure 3:
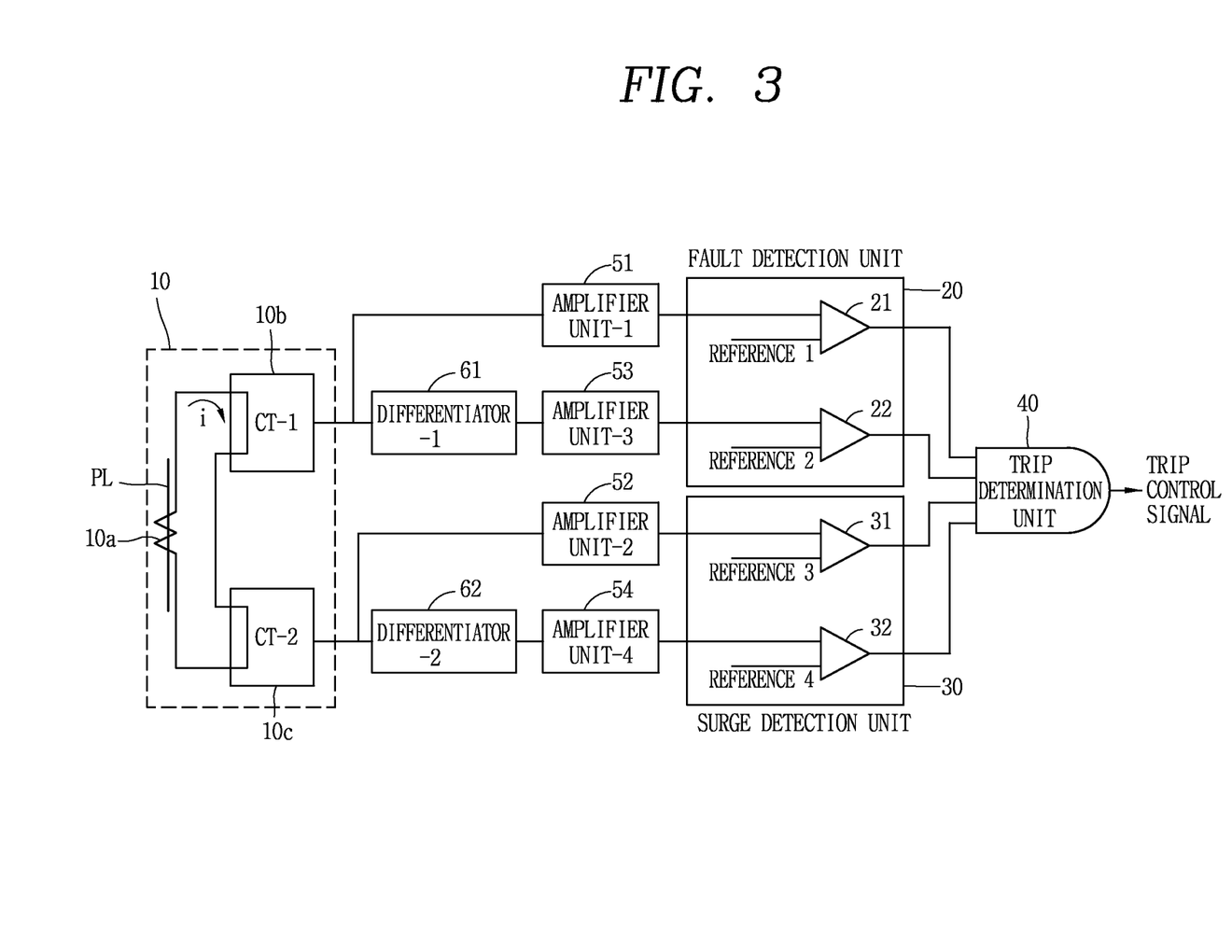
FIG. 3 is a block diagram illustrating the configuration of a high-speed fault current detection circuit according to still another embodiment of the present disclosure.

As illustrated in FIG. 3, a high-speed fault current detection circuit according to a third preferred embodiment of the present disclosure comprises a primary current transformer 10a, a pair of secondary current transformers 10b, 10c, a first amplifier circuit section 51, a first differentiator 61, a third amplifier circuit section 53, a second amplifier circuit section 52, a second differentiator 62, a fourth amplifier circuit section 54, a fault detection circuit section 20, a surge detection circuit section 30 and a trip determination circuit section 40.

As illustrated in FIG. 3, a high-speed fault current detection circuit according to a third preferred embodiment of the present disclosure further comprises a third amplifier circuit section 53 and a fourth amplifier circuit section 54 as a configuration difference from the foregoing high-speed fault current detection circuit according to a second preferred embodiment of the present disclosure. Accordingly, only constituent elements different from the second embodiment will be described to avoid the redundant description thereof.

The third amplifier circuit section 53 is connected to an output terminal of the first differentiator 61 to amplify and output a change gradient of the secondary conversion signal outputted from the first differentiator 61.

The fourth amplifier circuit section 54 is connected between an output terminal of the second differentiator 62 and the surge detection circuit section 30 to amplify and output a change gradient of the secondary conversion signal outputted from the second differentiator 62.

On the other hand, referring to FIG. 3, the fault detection circuit section 20 may comprise a first comparator 21 and a second comparator 22.

The first comparator 21 is connected to an output terminal of the first amplifier circuit section 51 to compare a current value represented by the amplified secondary conversion signal from the first amplifier circuit section 51 with a predetermined first reference value so as to output a first fault detection signal when the current value represented by the amplified secondary conversion signal is no less than the first reference value, namely, equal to or larger than the first reference value. Here, the first fault detection signal may be configured with a signal indicating a logical value "1".

The second comparator 22 is connected to an output terminal of the third amplifier circuit section 53 to compare an amplification value of the change gradient from the third amplifier circuit section 53 with a predetermined second reference value so as to output a second fault detection signal when the change gradient from the second amplifier circuit section is no less than the second reference value, namely, when the change gradient from the second amplifier circuit section is equal to or larger than the second reference value. Here, the second fault detection signal may be configured with a signal indicating a logical value "1".

Here, a configuration in which the fault detection circuit section 20 comprises the first comparator 21 and second comparator 22 has the same configuration as the fault detection circuit section 20 according to the foregoing first embodiment and second embodiment, and the redundant description thereof will be omitted.

Moreover, referring to FIG. 3, the surge detection circuit section 30 may comprise a third comparator 31 and a fourth comparator 32.

The third comparator 31 is connected to an output terminal of the second amplifier circuit section 52 to compare a current value represented by the amplified secondary conversion signal from the second amplifier circuit section 52 with a predetermined third reference value so as to output a first surge detection signal when the current value represented by the amplified secondary conversion signal from the second amplifier circuit section 52 is no less than the third reference value, namely, when the current value represented by the amplified secondary conversion signal from the second amplifier circuit section 52 is equal to or larger than the third reference value. Here, the first surge detection signal may be configured with a signal indicating a logical value "1".

The fourth comparator 32 is connected to an output terminal of the fourth amplifier circuit section 54 to compare an amplification value of the change gradient from the fourth amplifier circuit section 54 with a predetermined fourth reference value so as to output a second surge detection signal when the amplification value of the change gradient from the fourth amplifier circuit section 54 is no less than the fourth reference value, namely, equal to or larger than the fourth reference value. Here, the second surge detection signal may be configured with a signal indicating a logical value "1".

Furthermore, a configuration in which the surge detection circuit section 30 comprises the third comparator 31 and fourth comparator 32 has the same configuration as the surge detection circuit section 30 according to the foregoing first embodiment and second embodiment, and the redundant description thereof will be omitted.

According to a preferred aspect of the present disclosure, when an amplification ratio of the first amplifier circuit section 51 is a first amplification ratio, and an amplification ratio of the second amplifier circuit section 52 is a second amplification ratio, and an amplification ratio of the third amplifier circuit section 53 is a third amplification ratio, and an amplification ratio of the fourth amplifier circuit section 54 is a fourth amplification ratio, the first amplification ratio>the second amplification ratio, and the third amplification ratio>the fourth amplification ratio.

Furthermore, as illustrated in FIG. 3, in a high-speed fault current detection circuit according to a third embodiment of the present disclosure, the trip determination unit 40 is connected to an output terminal of the fault detection circuit section 20 and the surge detection circuit section 30 to receive the first fault detection signal, second fault detection signal, first surge detection signal and second surge detection signal, and when at least any one of the first fault detection signal, second fault detection signal, first surge detection signal and second surge detection signal is received, the trip determination circuit section 40 generates and outputs a trip control signal. To this end, the trip determination circuit section 40 may be configured with a logical OR circuit or logical AND circuit section.

The configuration and operation of the trip determination circuit section 40 according to the foregoing first embodiment and second embodiment may be configure to have the same configuration and operation of the trip determination circuit section 40 in a high-speed fault current detection circuit according to the foregoing third embodiment.

The operation of a high-speed fault current detection circuit having the foregoing configuration according to a preferred embodiment of the present disclosure will be described below.

First, the operation of a high-speed fault current detection circuit according to a first embodiment of the present disclosure will be described with reference to FIG. 1.

The primary current transformer 10a detects a current flowing through an electric power circuit (PL) in a grid and output a current detection signal (i).

The current detection signal (i) primarily detected and outputted by the primary current transformer 10a has a large value, and thus is not appropriate to a processing signal level of a digital circuit section such as a comparator, a differentiator circuit, a logic circuit and the like, and a pair of secondary current transformers 10b, 10c are connected to the fault detection circuit section 20 and surge detection circuit section 30, respectively, through an output terminal thereof to convert the current detection signal provided by the primary current transformer 10a into secondary conversion signals, respectively, with a small current and provide them to the fault detection circuit section 20 and surge detection circuit section 30, respectively.

The fault detection circuit section 20 determines that a fault current occurs on the electric power circuit by comparing a current value represented by a secondary conversion signal outputted from the secondary current transformer-1 10b with a predetermined reference current value when the current value represented by the secondary conversion signal is equal to or larger than the predetermined reference current value, and outputs a signal with a logical value "1" as a fault detection signal when determined that the fault current has occurred.

The surge detection circuit section 30 is connected to an output terminal of the other one of the pair of secondary current transformers 10b, 10c, namely, the secondary current transformer-2 10c to determine that a surge current occurs on the electric power circuit by comparing a current value represented by a secondary conversion signal outputted from the secondary current transformer-2 10c with a predetermined reference current value when the current value is larger than the predetermined reference current value, and outputs a signal with a logical value "1" as a surge detection signal when determined that the surge current has occurred.

When the trip determination circuit section 40 is configured with a logical OR circuit, the trip determination circuit section 40 generates and outputs a trip control signal when at least either one of the fault detection signal and the surge detection signal is received as a signal with a logical value "1".

When the trip determination circuit section 40 is configured with a logical AND circuit, the trip determination circuit section 40 generates and outputs a trip control signal only when a signal with a logical value "1" is received as the fault detection signal and the surge detection signal at the same time.

The trip control signal generated and output in this manner may be provided to a circuit breaker (not shown) to perform a trip operation or provided to a fault current limiter (not shown) to trip or limit a fault current and/or surge current occurred on the electric power circuit (PL) in the grid by allowing the relevant circuit breaker to perform a trip (automatic circuit break) operation in response to this or the fault current limiter to perform a fault current limiting operation in response to this, thereby protecting a circuit connected as a next stage of the relevant circuit breaker or fault current limiter and a load device connected thereto.

Next, the operation of a high-speed fault current detection circuit according to a second embodiment of the present disclosure will be described with reference to FIG. 2.

The primary current transformer 10a detects a current flowing through an electric power circuit (PL) in a grid and output a current detection signal (i).

Then, the pair of secondary current transformers 10b, 10c convert the current detection signal provided by the primary current transformer 10a into secondary conversion signals, respectively, with a small current such that the secondary current transformer-1 10b provides a secondary conversion signal to the first amplifier circuit section 51 and first differentiator 61, and the secondary current transformer-2 10c provides a secondary conversion signal to the second amplifier circuit section 52 and second differentiator 62.

As a result, the first amplifier circuit section 51 amplifies a secondary conversion signal outputted from the secondary current transformer-1 10b to output the amplified secondary conversion signal to the fault detection circuit section 20.

The first differentiator 61 differentiates a secondary conversion signal outputted from the secondary current transformer-1 10b to output a change gradient of the secondary conversion signal to the fault detection circuit section 20.

The second amplifier circuit section 52 amplifies and output the secondary conversion signal outputted from the secondary current transformer-2 10c to the surge detection circuit section 30.

The second differentiator 62 differentiate the secondary conversion signal outputted from the secondary current transformer-2 10c to output a change gradient of the secondary conversion signal to the surge detection circuit section 30.

Then, the first comparator 21 included in the fault detection circuit section 20 compares a current value represented by the amplified secondary conversion signal from the first amplifier circuit section 51 with a predetermined first reference value to output a first fault detection signal as a logical value "1" when the current value represented by the amplified secondary conversion signal is no less than the first reference value, namely, equal to or larger than the first reference value.

Furthermore, the second comparator 22 included in the fault detection circuit section 20 compares the change gradient value from the first differentiator 61 with a predetermined second reference value to output a second fault detection signal when the change gradient value from the first differentiator 61 is no less than the second reference value, namely, when a valued represented by the change gradient from the first differentiator 61 is equal to or larger than the second reference. Here, the second fault detection signal may be configured with a signal indicating a logical value "1".

The third comparator 31 compares a current value represented by the amplified secondary conversion signal from the second amplifier circuit section 52 with a predetermined third reference value to output a first surge detection signal as a logical value "1" when a current value represented by the amplified secondary conversion signal from the second amplifier circuit section 52 is no less than the third reference value, namely, when the current value represented by the amplified secondary conversion signal from the second amplifier circuit section 52 is equal to or larger than the third reference value.

The fourth comparator 32 compares a value of the change gradient from the second differentiator 62 with a predetermined fourth reference value to output a second surge detection signal when the value of the change gradient from the second differentiator 62 is no less than the fourth reference value, namely, equal to or larger than the fourth reference value. Here, the second surge detection signal may be configured with a signal indicating a logical value "1".

Then, when the trip determination circuit section 40 is configured with a logical OR circuit, the trip determination circuit section 40 generates and outputs a trip control signal when at least any one of the first fault detection signal, the second fault detection signal, the first surge detection signal and the second surge detection signal is received as a signal with a logical value "1".

When the trip determination circuit section 40 is configured with a logical AND circuit, the trip determination circuit section 40 generates and outputs a trip control signal when the first fault detection signal, the second fault detection signal, the first surge detection signal and the second surge detection signal are all received at the same time as a signal with a logical value "1".

Then, the use of the trip control signal is similar to the operation of the foregoing first embodiment, and thus provided to a circuit breaker (not shown) to perform a trip operation or provided to the fault current limiter (not shown).

Next, the operation of a high-speed fault current detection circuit according to a third embodiment of the present disclosure will be described with reference to FIG. 3.

The primary current transformer 10a detects a current flowing through an electric power circuit (PL) in a grid to primarily detect and output a current detection signal (i).

Then, a pair of secondary current transformers 10b, 10c convert the current detection signal provided by the primary current transformer 10a into secondary conversion signals, respectively, with a small current such that the secondary current transformer-1 10b provides a secondary conversion signal to the first amplifier circuit section 51 and first differentiator 61, and the secondary current transformer-2 10c provides a secondary conversion signal to the second amplifier circuit section 52 and second differentiator 62.

As a result, the first amplifier circuit section 51 amplifies the secondary conversion signal outputted from the secondary current transformer-1 10b to output the amplified secondary conversion signal to the fault detection circuit section 20.

The first differentiator 61 differentiates the secondary conversion signal outputted from the secondary current transformer-1 10b to output a change gradient of the secondary conversion signal to the third amplifier circuit section 53.

The second amplifier circuit section 52 amplifies and output the secondary conversion signal outputted from the secondary current transformer-2 10C to the surge detection circuit section 30.

The second differentiator 62 differentiate a secondary conversion signal outputted from the secondary current transformer-2 10c to output a change gradient of the secondary conversion signal to the fourth amplifier circuit section 54.

The fourth amplifier circuit section 54 amplifies and outputs a signal represented by a change gradient from the second differentiator 62 to the surge detection circuit section 30.

Then, the first comparator 21 included in the fault detection circuit section 20 compares a current value represented by the amplified secondary conversion signal from the first amplifier circuit section 51 with a predetermined first reference value to output a first fault detection signal as a logical value "1" when the current value represented by the amplified secondary conversion signal is no less than the first reference value, namely, equal to or larger than the first reference value.

Furthermore, the second comparator 22 included in the fault detection circuit section 20 compares an amplification value of the change gradient value from the third amplifier circuit section 53 with a predetermined second reference value to output a second fault detection signal when the amplification value of the change gradient value from the first differentiator 61 is no less than the second reference value, namely, when the amplification value of the change gradient from the first differentiator 61 is equal to or larger than the second reference. Here, the second fault detection signal may be configured with a signal indicating a logical value "1".

The third comparator 31 compares a current value represented by the amplified secondary conversion signal from the second amplifier circuit section 52 with a predetermined third reference value to output a first surge detection signal as a logical value "1" when a current value represented by the amplified secondary conversion signal from the second amplifier circuit section 52 is no less than the third reference value, namely, when the current value represented by the amplified secondary conversion signal from the second amplifier circuit section 52 is equal to or larger than the third reference value.

The fourth comparator 32 compares an amplification value of the change gradient from the fourth amplifier circuit section 54 with a predetermined fourth reference value to output a second surge detection signal when the amplification value of the change gradient from the second differentiator 62 is no less than the fourth reference value, namely, equal to or larger than the fourth reference value. Here, the second surge detection signal may be configured with a signal indicating a logical value "1".

Then, when the trip determination circuit section 40 is configured with a logical OR circuit, the trip determination circuit section 40 generates and outputs a trip control signal when at least any one of the first fault detection signal, the second fault detection signal, the first surge detection signal and the second surge detection signal is received as a signal with a logical value "1".

It denotes that in a case where a fault current which is no less than a rated current of the circuit breaker is currently detected as a detection current in a grid, or in a case where a change gradient of the detection current is abruptly increased, or in a case where the detection is no less than a reference value regarded as a surge current or in a case where a change gradient of the detection current is no less than a typical reference change rate of the surge current, a high-speed fault current detection circuit according to the present disclosure outputs a trip control signal, thereby opening the electric power circuit through a circuit breaker or limiting a current through the fault current limiter.

When the trip determination circuit section 40 is configured with a logical AND circuit, the trip determination circuit section 40 generates and outputs a trip control signal when the first fault detection signal, the second fault detection signal, the first surge detection signal and the second surge detection signal are all received at the same time as a signal with a logical value "1".

It denotes that in a case where a fault current which is no less than a rated current of the circuit breaker is currently detected as a detection current in a grid while in a case where a change gradient of the detection current is abruptly increased, and in a case where the detection is no less than a reference value regarded as a surge current while in a case where a change gradient of the detection current is no less than a typical reference change rate of the surge current, a high-speed fault current detection circuit according to the present disclosure outputs a trip control signal, thereby opening a circuit through a circuit breaker or limiting a current through the fault current limiter.

As described above, a high-speed fault current detection circuit according to the present disclosure may be configured with a pair of (two) secondary current transformers, and those secondary current transformers, respectively, are configured to connect to the fault detection circuit section for detecting a fault current exceeding a rated current of the circuit breaker and the surge detection circuit section for detecting a surge current in a separate manner so as to independently detect a fault current and a surge current having largely different current sizes thereof, thereby providing an effect of enhancing detection accuracy.

A high-speed fault current detection circuit according to the present disclosure may comprise a first amplifier circuit section configured to amplify a secondary conversion signal outputted by either one of the one pair of secondary current transformers and output the amplified secondary conversion signal to the fault detection circuit section, a first differentiator configured to differentiate a secondary conversion signal outputted by either one of the one pair of secondary current transformers and output a change gradient of the secondary conversion signal to the fault detection circuit section, a second amplifier circuit section configured to amplify a secondary conversion signal outputted by the other one of the one pair of secondary current transformers and output the amplified secondary conversion signal to the surge detection circuit section, and a second differentiator configured to output a change gradient of the secondary conversion signal outputted by the other one of the one pair of secondary current transformers to the surge detection circuit section, thereby obtaining an effect of allowing the fault detection circuit section to receive the amplified secondary conversion signal which is a failure current detection signal from the relevant secondary current transformer as well as receiving its change gradient, and allowing the surge detection circuit section to receive the amplified secondary conversion signal which is a surge detection signal from the relevant secondary current transformer as well as receiving its change gradient.

In a high-speed fault current detection circuit according to the present disclosure, the fault detection circuit section may comprise a first comparator configured to compare a current value represented by the amplified secondary conversion signal from the first amplifier circuit section with a predetermined first reference value, and a second comparator configured to compare the change gradient of the secondary conversion signal with a predetermined second reference value, thereby obtaining an effect of determining whether or not a fault current exceeding a reference current has occurred as well as determining whether the change gradient exceeds a reference value.

In a high-speed fault current detection circuit according to the present disclosure, the surge detection circuit section may comprise a third comparator configured to compare a current value represented by the amplified secondary conversion signal from the second amplifier circuit section with a predetermined third reference value, and a fourth comparator configured to compare a change gradient of the secondary conversion signal outputted by the second differentiator with a predetermined fourth reference value, thereby obtaining an effect of determining whether or not a surge current exceeding a reference current has occurred as well as determining whether the change gradient of the surge current exceeds a reference value.

In a high-speed fault current detection circuit according to the present disclosure, when an amplification ratio of the first amplifier circuit section is a first amplification ratio, and an amplification ratio of the second amplifier circuit section is a second amplification ratio, and an amplification ratio of the third amplifier circuit section is a third amplification ratio, and an amplification ratio of the fourth amplifier circuit section is a fourth amplification ratio, an amplification ratio of the amplifier unit configured to amplify a surge current or a change gradient of the surge current with regard to the surge current having a larger current value compared to the fault current may be configured to be different (smaller) than that of the amplification unit configured to amplify a detection fault current having a value smaller than that or a change gradient of the detection fault current, thereby providing an effect of enhancing the detection reliability of the fault current as well as the surge current.

In a high-speed fault current detection circuit according to the present disclosure, the trip determination unit may be configured with a logical OR circuit to generate a trip control signal when a fault current is detected or a change gradient of the fault current is abrupt or a surge current is detected or a change gradient of the surge current is abrupt so as to perform a circuit breaking or fault current limiting operation in the relevant case, thereby obtaining an effect of protecting a circuit connected as next stage thereof and a load device connected to the circuit from the fault current or surge current.

In a high-speed fault current detection circuit according to the present disclosure, the trip determination unit may be configured with a logical AND circuit to generate a trip control signal when a fault current is detected and a change gradient thereof is abrupt and a surge current is also detected and a change gradient thereof is also abrupt so as to perform a circuit breaking or fault current limiting operation with respect to a large detection current indicating an abrupt change gradient, thereby obtaining an effect of preventing an error operation of the circuit breaker or fault current limiter.

What is claimed is:

1. A high-speed fault current detection circuit, comprising:
    a primary current transformer configured to detect a current flowing through an electric power circuit in a grid to output a current detection signal;
    a pair of secondary current transformers connected to the primary current transformer to convert and provide the current detection signal provided by the primary current transformer into secondary conversion signals, respectively;
    a fault detection circuit section connected to any one output terminal of the one pair of secondary current transformers to determine whether or not a fault current occurs on the electric power circuit by comparing a current value represented by a secondary conversion signal outputted by either one of the one pair of secondary current transformers with a predetermined reference current value of said fault detection circuit section, and output a fault detection signal when determined that the fault current has occurred;
    a surge detection circuit section connected to the other output terminal of the one pair of secondary current transformers to determine whether or not a surge current occurs on the electric power circuit by comparing a current value represented by a secondary conversion signal outputted by the other one of the one pair of secondary current transformers with a predetermined reference current value of said surge detection circuit section, and output a surge detection signal when determined that the surge current has occurred; and
    a trip determination unit connected to output terminals of the fault detection circuit section and the surge detection circuit section to receive the fault detection signal and the surge detection signal, and generates a trip control signal when at least either one of the fault detection signal and the surge detection signal is received.

2. The high-speed fault current detection circuit of claim 1, further comprising:
    a first amplifier circuit section connected between either one output terminal of the one pair of secondary current transformers and the fault detection circuit section to amplify a secondary conversion signal outputted by either one of the one pair of secondary current transformers and output the amplified secondary conversion signal to the fault detection circuit section;
    a first differentiator connected between either one output terminal of the one pair of secondary current transformers and the fault detection circuit section to differentiate a secondary conversion signal outputted by either one of the one pair of secondary current transformers and output a change gradient of the secondary conversion signal to the fault detection circuit section;
a second amplifier circuit section connected between the other output terminal of the one pair of secondary current transformers and the surge detection circuit section to amplify a secondary conversion signal outputted by the other one of the one pair of secondary current transformers and output the amplified secondary conversion signal to the surge detection circuit section; and
a second differentiator connected between the other output terminal of the one pair of secondary current transformers and the surge detection circuit section to differentiate a secondary conversion signal outputted by the other one of the one pair of secondary current transformers and output a change gradient of the secondary conversion signal to the surge detection circuit section.

3. The high-speed fault current detection circuit of claim 2, wherein the fault detection circuit section comprises:
a first comparator connected to an output terminal of the first amplifier circuit section to compare a current value represented by the amplified secondary conversion signal from the first amplifier circuit section with a predetermined first reference value; and
a second comparator configured to compare the change gradient with a predetermined second reference value.

4. The high-speed fault current detection circuit of claim 3, wherein the surge detection circuit section comprises:
a third comparator connected to an output terminal of the second amplifier circuit section to compare a current value represented by the amplified secondary conversion signal from the second amplifier circuit section with a predetermined third reference value; and
a fourth comparator configured to compare a change gradient of the secondary conversion signal outputted by the second differentiator with a predetermined fourth reference value.

5. The high-speed fault current detection circuit of claim 1, further comprising:
a first amplifier circuit section connected to either one output terminal of the one pair of secondary current transformers to amplify a secondary conversion signal outputted by either one of the one pair of secondary current transformers and output the amplified secondary conversion signal;
a first differentiator connected to either one output terminal of the one pair of secondary current transformers to differentiate a secondary conversion signal outputted by either one of the one pair of secondary current transformers and output a change gradient of the secondary conversion signal;
a third amplifier circuit section connected to an output terminal of the first differentiator to amplify and output a change gradient of the secondary conversion signal outputted by the first differentiator;
a second amplifier circuit section connected to the other output terminal of the one pair of secondary current transformers to amplify a secondary conversion signal outputted by the other one of the one pair of secondary current transformers and output the amplified secondary conversion signal;
a second differentiator connected to the other output terminal of the one pair of secondary current transformers to differentiate a secondary conversion signal outputted by the other one of the one pair of secondary current transformers and output a change gradient of the secondary conversion signal; and
a fourth amplifier circuit section connected to an output terminal of the second differentiator to amplify a change gradient of the secondary conversion signal outputted by the second differentiator,
wherein the fault detection circuit section comprises:
a first comparator connected to an output terminal of the first amplifier circuit section to compare a current value represented by the amplified secondary conversion signal from the first amplifier circuit section with a predetermined first reference value so as to output a first fault detection signal when the current value represented by the amplified secondary conversion signal is no less than the first reference value; and
a second comparator connected to an output terminal of the third amplifier circuit section to compare an amplification value of the change gradient from the third amplifier circuit section with a predetermined second reference value so as to output a second fault detection signal when the change gradient from the third amplifier circuit section is no less than the second reference value, and
the surge detection circuit section comprises:
a third comparator connected to an output terminal of the second amplifier circuit section to compare a current value represented by the amplified secondary conversion signal from the second amplifier circuit section with a predetermined third reference value so as to output a first surge detection signal when the current value represented by the amplified secondary conversion signal from the second amplifier circuit section is no less than the third reference value; and
a fourth comparator connected to an output terminal of the fourth amplifier circuit section to compare an amplification value of the change gradient from the fourth amplifier circuit section with a predetermined fourth reference value so as to output a second surge detection signal when the amplification value of the change gradient from the fourth amplifier circuit section is no less than the fourth reference value, and
the trip determination unit is connected to output terminals of the fault detection circuit section and the surge detection circuit section to receive the first fault detection signal, second fault detection signal, first surge detection signal and second surge detection signal, and configured to generate a trip control signal when at least any one of the first fault detection signal, second fault detection signal, first surge detection signal and second surge detection signal is received.

6. The high-speed fault current detection circuit of claim 5, wherein when an amplification ratio of the first amplifier circuit section is a first amplification ratio, and an amplification ratio of the second amplifier circuit section is a second amplification ratio, and an amplification ratio of the third amplifier circuit section is a third amplification ratio, and an amplification ratio of the fourth amplifier circuit section is a fourth amplification ratio,
the first amplification ratio greater than the second amplification ratio, and the third amplification ratio greater than the fourth amplification ratio.

7. The high-speed fault current detection circuit of claim 1, wherein the trip determination unit is configured with a logical OR circuit.

8. The high-speed fault current detection circuit of claim 1, wherein the trip determination unit is configured with a logical AND circuit.

* * * * *